United States Patent
Beck et al.

(10) Patent No.: US 9,560,294 B2
(45) Date of Patent: Jan. 31, 2017

(54) SYSTEMS AND METHODS FOR PIXEL-LEVEL DARK CURRENT COMPENSATION IN IMAGE SENSORS

(71) Applicant: SEMICONDUCTOR COMPONENTS INDUSTRIES, LLC, Phoenix, AZ (US)

(72) Inventors: Jeffery Beck, Philomath, OR (US); Charles McCord, Corvallis, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 64 days.

(21) Appl. No.: 14/566,393

(22) Filed: Dec. 10, 2014

(65) Prior Publication Data
US 2016/0173794 A1  Jun. 16, 2016

(51) Int. Cl.
| | |
|---|---|
| H04N 9/64 | (2006.01) |
| H04N 5/228 | (2006.01) |
| H04N 5/235 | (2006.01) |
| H04N 5/361 | (2011.01) |
| H01L 27/146 | (2006.01) |

(52) U.S. Cl.
CPC .......... *H04N 5/361* (2013.01); *H01L 27/1464* (2013.01); *H01L 27/14601* (2013.01)

(58) Field of Classification Search
CPC ............. G01J 2001/444; H01L 27/14623; H04N 5/361; H04N 5/2176; H04N 5/2178; H04N 5/3658
USPC ............ 348/241–245, 222.1, 229.1; 250/238
See application file for complete search history.

(56) References Cited

U.S. PATENT DOCUMENTS

| | | |
|---|---|---|
| 5,272,536 A | 12/1993 | Sudo et al. |
| 5,521,639 A | 5/1996 | Tomura et al. |
| 6,101,287 A * | 8/2000 | Corum ............... G06T 5/50 348/E5.081 |
| 6,583,416 B1 * | 6/2003 | Villani ............... G01J 5/06 250/332 |
| 6,607,301 B1 * | 8/2003 | Glukhovsky .......... A61B 1/041 374/117 |
| 6,714,241 B2 | 3/2004 | Baer |
| 6,744,526 B2 | 6/2004 | McDermott et al. |

(Continued)

OTHER PUBLICATIONS

Vanhoff, U.S. Appl. No. 14/606,562, filed Jan. 27, 2015.

(Continued)

*Primary Examiner* — Chia-Wei A Chen
(74) *Attorney, Agent, or Firm* — Treyz Law Group, P. C.; Zachary D. Hadd

(57) ABSTRACT

An imaging system may include processing circuitry, a lens, and an array of pixels including image sensor pixels and temperature sensor pixels. The image sensor pixels may generate image pixel values in response to image light received through the lens. The temperature sensor pixels may generate thermal estimate signals based on the temperature of the pixel array. The image sensor pixels and temperature sensor pixels may generate dark current. As the temperature of the pixel array increases, the image sensor pixels and temperatures sensor pixels may generate increased dark current. Temperature sensor pixels may generate more dark current than image sensor pixels. Dark current generated by the temperature sensor pixels may be used to generate dark current compensation values that may compensate for the dark current generated by the image sensor pixels.

12 Claims, 6 Drawing Sheets

(56) References Cited

U.S. PATENT DOCUMENTS

| | | | |
|---|---|---|---|
| 7,167,267 B2* | 1/2007 | Robins | H04N 5/361 348/E5.081 |
| 7,391,448 B2* | 6/2008 | Nishizawa | H01L 27/148 257/E27.15 |
| 7,567,277 B2* | 7/2009 | Inaba | H04N 5/3658 348/245 |
| 7,639,291 B2 | 12/2009 | Lim et al. | |
| 7,813,586 B2* | 10/2010 | Gutkowicz-Krusin | H04N 5/21 348/241 |
| 8,228,402 B2 | 7/2012 | Egawa | |
| 8,463,068 B2 | 6/2013 | Hunter | |
| 2002/0024001 A1* | 2/2002 | Hiyama | H01L 27/14603 250/208.1 |
| 2004/0099920 A1* | 5/2004 | Rossi | H04N 5/361 257/448 |
| 2006/0011952 A1* | 1/2006 | Ohkawa | H01L 27/14609 257/291 |
| 2008/0012965 A1* | 1/2008 | Kitani | H04N 5/361 348/243 |
| 2008/0217712 A1* | 9/2008 | Rossi | H01L 27/14623 257/431 |
| 2009/0021606 A1* | 1/2009 | Kuruma | H04N 5/3653 348/231.99 |
| 2009/0268063 A1* | 10/2009 | Ellis-Monaghan | H04N 5/361 348/246 |
| 2010/0194936 A1* | 8/2010 | Kanbe | H01L 27/14609 348/243 |
| 2011/0115952 A1* | 5/2011 | Watanabe | H04N 5/3595 348/243 |
| 2012/0026370 A1* | 2/2012 | Oike | H04N 5/2176 348/298 |
| 2012/0199930 A1* | 8/2012 | Hayashi | H01L 27/1461 257/435 |
| 2012/0212657 A1* | 8/2012 | Mo | H04N 5/378 348/300 |
| 2013/0021497 A1* | 1/2013 | Kawamura | H04N 5/361 348/231.3 |
| 2013/0056616 A1* | 3/2013 | Kai | H01L 27/14623 250/208.1 |
| 2014/0211057 A1* | 7/2014 | Chien | H04N 5/361 348/308 |
| 2014/0313375 A1 | 10/2014 | Mlinar | |
| 2015/0264283 A1* | 9/2015 | Kobayashi | H04N 5/361 257/229 |
| 2016/0028976 A1* | 1/2016 | Ran | H04N 5/365 348/243 |
| 2016/0044259 A1* | 2/2016 | Takado | H04N 5/378 348/297 |
| 2016/0099278 A1* | 4/2016 | Guyader | H01L 27/1462 257/432 |

OTHER PUBLICATIONS

"Coons patch", Wikipedia, Jan. 23, 2014 (Jan. 23, 2014), Retrieved from the Internet: URL: <http://en.wikipedia.org/wiki/Coons_patch> [retrieved on Jan. 21, 2015].

* cited by examiner

SYSTEMS AND METHODS FOR PIXEL-LEVEL DARK CURRENT COMPENSATION IN IMAGE SENSORS

BACKGROUND

This relates to solid-state image sensor arrays and, more particularly, to image sensors with temperature sensor pixels for performing dark current compensation.

Image sensors are commonly used in electronic devices such as cellular telephones, cameras, and computers to capture images. In a typical arrangement, an electronic device is provided with an array of image pixels. The image pixels generate image signals in multiple color channels. Readout circuitry such as analog-to-digital converter circuits are commonly coupled to the image pixels for reading out image signals from the image pixels.

In an image sensor, the temperature of the image sensor substrate typically affects the image signals generated by the image pixels. In a typical pixel photodiode, there is some current (i.e., dark current) in the photodiode even when no light is incident upon the photodiode (due to the inherent movement of electrons across the corresponding semiconductor junction). As the temperature of the photodiode increases, this flow of the electrons, and therefore the dark current, increases. Increased dark current in the image sensor can cause excessive and unsightly noise in the final image signal.

Because the level of dark current generated by a photodiode is temperature-dependent, it is useful to be able to detect the temperature of the image sensor array so that dark current contributions to the final image signal can be compensated for. In some conventional image sensors, a junction sensor is placed on the image sensor substrate separated from the pixel array. However, the junction sensor can only measure the temperature of the image sensor array substrate at the location at which the junction sensor is placed, resulting in a single temperature reading that is representative of one location on the image sensor. The image sensor then uses this temperature reading to generate a correction value for correcting for temperature-based dark current in the captured image signals. However, in this scenario, the correction value will inaccurately estimate the temperature and corresponding dark current signal contribution for pixels at positions on the substrate that are far from the junction sensor.

It would therefore be desirable to provide imaging devices with improved systems and methods for detecting array temperatures and compensating for dark current in the array.

DETAILED DESCRIPTION

Electronic devices such as digital cameras, computers, cellular telephones, and other electronic devices include image sensors that gather incoming light to capture an image. The image sensors may include arrays of image sensor pixels (sometimes referred to herein as image pixels). The image pixels in the image sensors may include photosensitive elements such as photodiodes that convert the incoming light into image signals. Image sensors may have any number of pixels (e.g., hundreds, thousands, millions or more). A typical image sensor may, for example, have hundreds of thousands or millions of pixels (e.g., megapixels). Image sensors may include control circuitry such as circuitry for operating the image pixels, readout circuitry for reading out image signals corresponding to the electric charge generated by the photosensitive elements, and, if desired, other processing circuitry such as analog processing circuitry and digital processing circuitry. An image sensor may be coupled to additional processing circuitry such as circuitry on a companion chip to the image sensor, circuitry in the device that is coupled to the image sensor by one or more cables or other conductive lines, or external processing circuitry.

Figure 1:
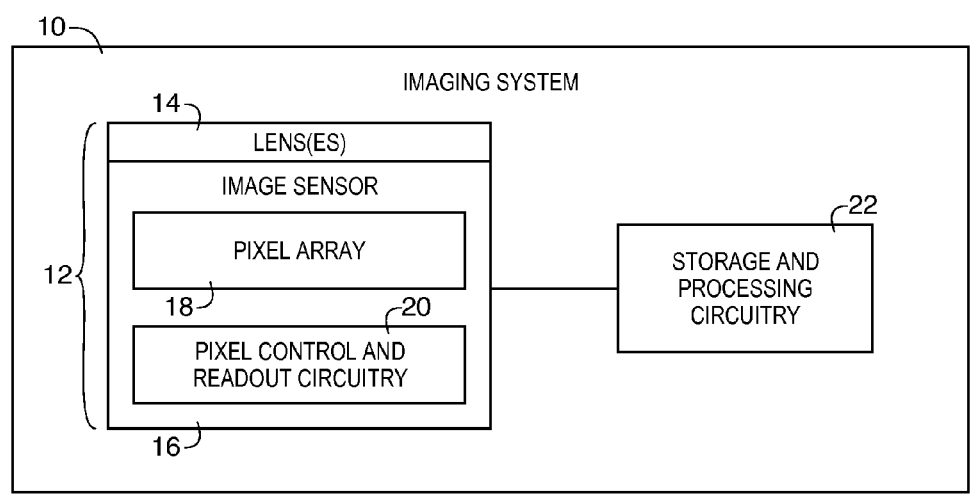
FIG. 1 is a diagram of an illustrative electronic device having an imaging system with an image sensor and processing circuitry in accordance with an embodiment of the present invention.

FIG. 1 is a diagram of an illustrative imaging system that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and image sensor circuitry 16 (e.g., one or more corresponding image sensors). Image sensor circuitry 16 (sometimes referred to herein as image sensor 16) may include an array of image sensor pixels 18 (sometimes referred to herein as array 18 or pixel array 18) and pixel control and readout circuitry 20 (sometimes referred to herein as pixel readout circuitry 20 or pixel readout and processing circuitry 20). During image capture operations, light from a scene may be focused onto image sensor pixel array 18 by lens 14. Image sensor 16 may include any number of pixel arrays 18 (e.g., one pixel array, two pixel arrays, ten pixel arrays, etc.). If desired, camera module 12 may be provided with an array of lenses 14 and an array of corresponding image sensors 16.

Image sensor pixels in pixel array 18 may generate image signals in response to receiving light from a scene. For example, image sensor pixels in array 18 may include photosensitive elements such as photodiodes that convert incoming light into electric charge. Image pixels in pixel array 18 may be controlled using pixel control and readout circuitry 20. Pixel control and readout circuitry 20 may include any desired pixel control and/or readout circuitry (e.g., row control circuitry, column read out circuitry, etc.). Pixel control and readout circuitry 20 may include circuitry for converting analog image signals into corresponding digital image pixel data (e.g., a respective pixel value generated by each image sensor pixel). Pixel values generated by pixel array 18 and pixel control and readout circuitry 20 may be provided to storage and processing circuitry 22.

If desired, pixel array 18 may include temperature sensor pixels for estimating a localized temperature of a portion of array 18 (e.g., of a semiconductor substrate on which array 18 is formed). For example, temperature sensor pixels may include image sensor pixels in which a portion of an image sensor pixel has been modified. In one illustrative example, temperature sensor pixels may be image sensor pixels that have been modified such that the temperature sensor pixels are not exposed to light incident upon the pixel array and that do not convert incoming light into electric charge. Temperature sensor pixels may produce signals in response to dark current (e.g., temperature sensor pixels may not produce a photocurrent or may only produce dark current), and may be configured to generate increased levels of dark current compared to image sensor pixels in the array (e.g., pixels used for capturing image data in response to light received from an imaged scene).

Temperature sensor pixels in array 18 may produce thermal estimate signals that are representative of the temperature of the temperature sensor pixels at a desired location on pixel array 18. The thermal estimate signals may, for example, be dark current signals. These thermal estimate signals may be converted to digital thermal estimate values (e.g., at circuitry 20) that can be used to generate dark current compensation values for the image sensor pixels. If desired, pixel control and readout circuitry 20 may include thermal gradient processing circuitry for performing dark current compensation operations on digital image pixel signals generated by image sensor pixels in pixel array 18 based on the dark current compensation values calculated from the thermal estimate signals generated by the temperature sensor pixels.

Image sensor 16 may receive control signals from storage and processing circuitry 22 and may supply pixel data to storage and processing circuitry 22. Storage and processing circuitry 22 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using storage and processing circuitry 22. Processed image data may, if desired, be provided to external equipment (e.g., a computer or other device) using wired and/or wireless communications paths coupled to storage and processing circuitry 22.

Figure 2:
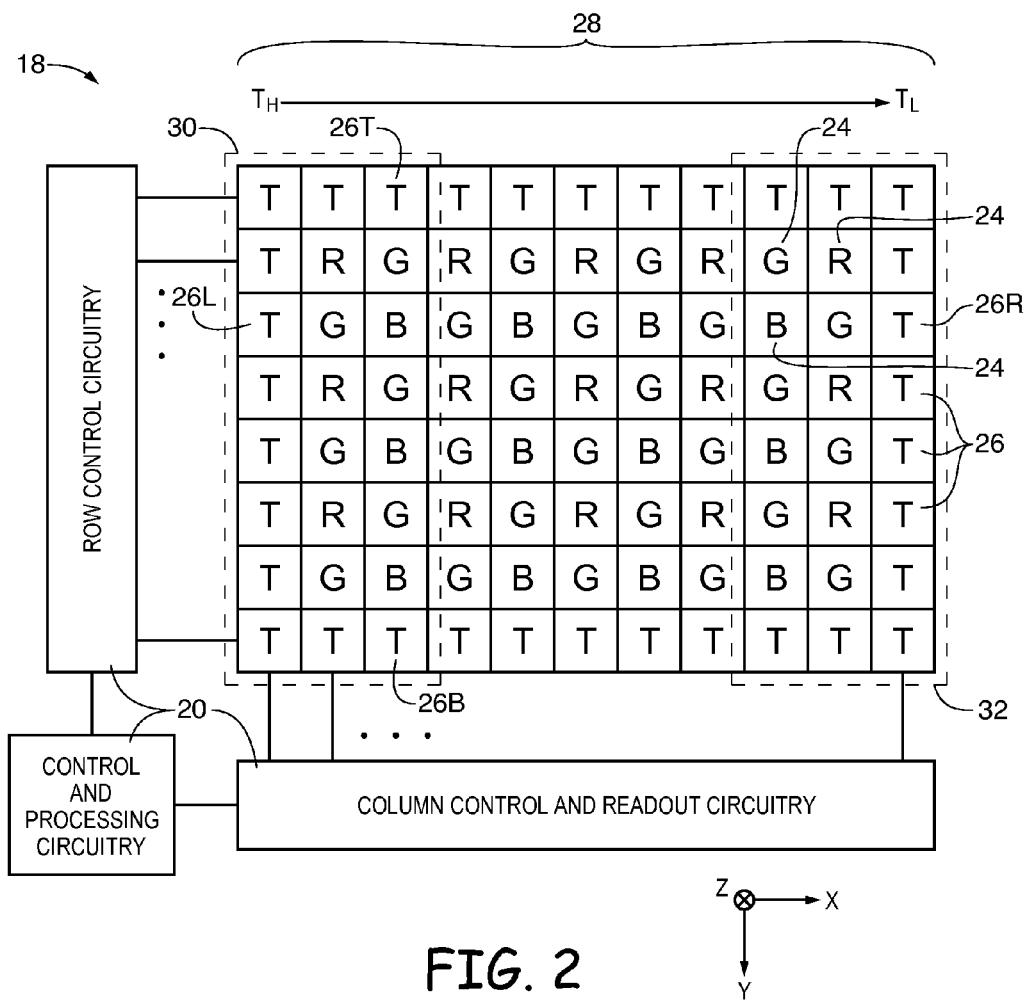
FIG. 2 is a diagram of an illustrative pixel array having image sensor pixels and temperature sensor pixels for compensating for dark current contributions in the array in accordance with an embodiment of the present invention.

As shown in FIG. 2, image sensor 16 may include one or more arrays of pixels such as pixel array 18 containing image sensor pixels 24. Array 18 may contain, for example, hundreds or thousands of rows and columns of image sensor pixels 26. Image sensor pixels 24 may be covered by a color filter array that includes color filter elements over some or all of image sensor pixels 24. Color filter elements for image sensor pixels 24 may be red color filter elements (e.g., photoresistive material that passes red light while reflecting and/or absorbing other colors of light), blue color filter elements (e.g., photoresistive material that passes blue light while reflecting and/or absorbing other colors of light), green color filter elements (e.g., photoresistive material that passes green light while reflecting and/or absorbing other colors of light), clear color filter elements (e.g., transparent material that passes red, blue and green light), yellow color filter elements, or any other desired color filter elements.

Array 18 may include one or more pixels such as temperature sensor pixels 26. For example, array 18 may contain temperature sensor pixels 26 arranged around the border (periphery) of array 18. In such an arrangement, the border formed by the temperature sensor pixels may be one pixel wide, two pixels wide, ten pixels wide, or may have a width corresponding to any other suitable number of pixels. The border arrangement illustrated in FIG. 2 is merely illustrative. Temperature sensor pixels 26 may be positioned in any suitable location on pixel array 18. For example, temperature sensor pixels 26 may be positioned randomly throughout array 18, along one side or more than one side of array 18, or in the middle of array 18 (e.g., temperature sensor pixels 26 may be formed from or may replace image sensor pixels 24 in array 18).

During operation of electronic device 10, components of camera module 12 and image sensor 16 such as pixel control and readout circuitry 20, storage and processing circuitry 22, integrated circuits, other electronic components, or any other components of electronic device 10 may generate heat. Such components may be mounted directly on or near pixel array 18, such as on a pixel array substrate on which pixel array 18 is formed. Heat that is generated by circuitry in electronic device 10, such as heat generated by components such as pixel control and readout circuitry 20 and other electronic components of image sensor 16 that are mounted directly on or near pixel array 18, may change the temperature of pixel array 18 and cause a temperature gradient such as temperature gradient 28 (sometimes referred to herein as thermal gradient 28) to form on pixel array 18. As shown in the illustrative example of FIG. 2, temperature gradient 28 may be formed along the horizontal direction across pixel array 18. In such an example, temperature gradient 28 may include areas of pixel array 18 having higher temperatures such as a high temperature region 30 at temperature $T_H$ (sometimes referred to herein is a $T_H$ region) and a low temperature region 32 at temperature $T_L$ (sometimes referred to herein as a $T_L$ region). In some instances, high temperature region 30 may form on image pixel array 18 near control circuitry of electronic device 10 or image sensor 16, such as pixel control and readout circuitry 20, whereas low temperature regions 32 may form in an areas of image pixel array 18 that are farther from control circuitry of electronic device 10 or image sensor 16. This, however, is merely illustrative. High temperature regions 30 and low temperature regions 32 may form anywhere on image pixel array 18 and may or may not be near control circuitry or other electronic components of electronic device 10 or image sensor 16.

In one situation that is sometimes discussed herein as an example, as the temperature of array 18 or portions of array 18 increases, the temperatures of pixels in array 18 such as image sensor pixels 24 increase. For example, the temperatures of image sensor pixels 24 in a high temperature region 30 may be higher than the temperatures of image sensor pixels 24 in a low temperature region 32. The properties of image sensor pixels 24 in a high temperature region 30 may be different than the properties of image sensor pixels 24 in a low temperature region 32. For example, image sensor pixels 24 in a high temperature region 30 may generate increased levels of dark current when compared to image sensor pixels 24 in a low temperature region 32.

As the temperature of array 18 increases, the temperatures of temperature sensor pixels 26 may increase. For example, the temperatures of temperature sensor pixels 26 in a high temperature region 30 may be higher than the temperatures of temperature sensor pixels 26 in a low temperature region 32. Temperature sensor pixels 26 that have a higher temperature may generate increased dark current when compared to temperature sensor pixels 26 that have a lower temperature. Temperature sensor pixels 26 may be configured to have different properties than image sensor pixels 24, such that temperature sensor pixels 26 may be more sensitive to changes in temperature along temperature gradient 28, and may experience greater fluctuations in dark current generation between high temperature regions 30 and low temperature regions 32 than image sensor pixels 24. For example, temperature sensor pixels 26 that have a higher temperature may generate more dark current than image sensor pixels 24 having the same temperature.

Figure 3A:
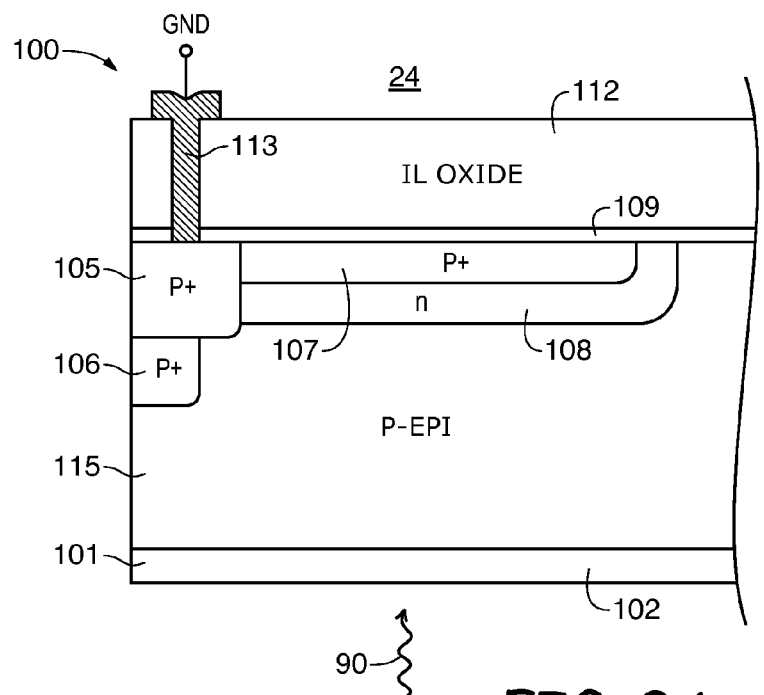
FIG. 3A is a cross-sectional diagram of a buried image sensor pixel photodiode for use in an image sensor pixel having an n-type doped layer that is buried by a p+ type doped layer that reduces dark current generated at the semiconductor junction in accordance with an embodiment of the present invention.

FIG. 3A is a cross-sectional side view of a portion of light gathering image sensor pixel 24 (e.g., a pixel for generating image data in response to light from a scene). Image sensor pixel 24 may be formed on substrate 101 in array 18. Image sensor pixel 24 may include a photodiode such as photodiode 100. Photodiode 100 may be formed by p+ type doped layer 107 and n-type doped layer 108 at the front surface (side) of substrate 101. P+ type doped layer 107 reduces dark current generated by photodiode 100. The front (upper) surface of epitaxial p-type doped layer 115 is covered by oxide layer 109 that isolates the doped poly-silicon charge transfer (TX) gate (not shown) from substrate 101. Charge generated by impinging photons 90 is accumulated at n-type doped layer 108. This example is merely illustrative and, if desired, photons 90 may be received through the front surface. Pixels such as image sensor pixels 24 may be isolated from each other by p+ type doped regions 105 and 106 that extend through epitaxial p-type doped layer 115 down to p+ type doped layer 102. The pixel is covered by inter-level (IL) oxide layers 112 (only one inter-level oxide layer is shown) that are used for the pixel metal wiring and interconnect isolation. The active pixel circuit components are connected to the wiring by metal vias deposited through contact holes 113.

In a photodiode such as photodiode 100 of image light sensing pixel 24, it may be desirable to decrease the level of dark current generated by the photodiode so that the image signal output from image sensor pixel 24 is representative of photocurrent generated by photons such as photons 90 incident upon the photodiode 100 (e.g., with a minimized dark current contribution). Using a "buried" region such as n-type doped layer 108 (buried, for example, by p+ type doped layer 107), the amount of dark current generated by photodiode 100 and thus the dark current contribution to the overall signal produced by photodiode 100 may be limited. This can provide photodiode 100 with greater sensitivity and allow image sensor pixel 24 to output a signal with a lower dark current contribution. However, the use of a buried region such as n-type doped layer 108 does not eliminate all dark current generated by photodiode 100. Furthermore, the amount of dark current generated by photodiode 100 may change as the temperatures of image sensor pixel 24 and photodiode 100 in array 18 increase due to heat generated from electronic components of electronic device 10. It is therefore desirable to be able to compensate for the dark current that is produced by photodiode 100, and in particular, to compensate for dark current generated due to temperature changes on array 18 or temperature gradients such as thermal gradient 28.

Figure 3B:
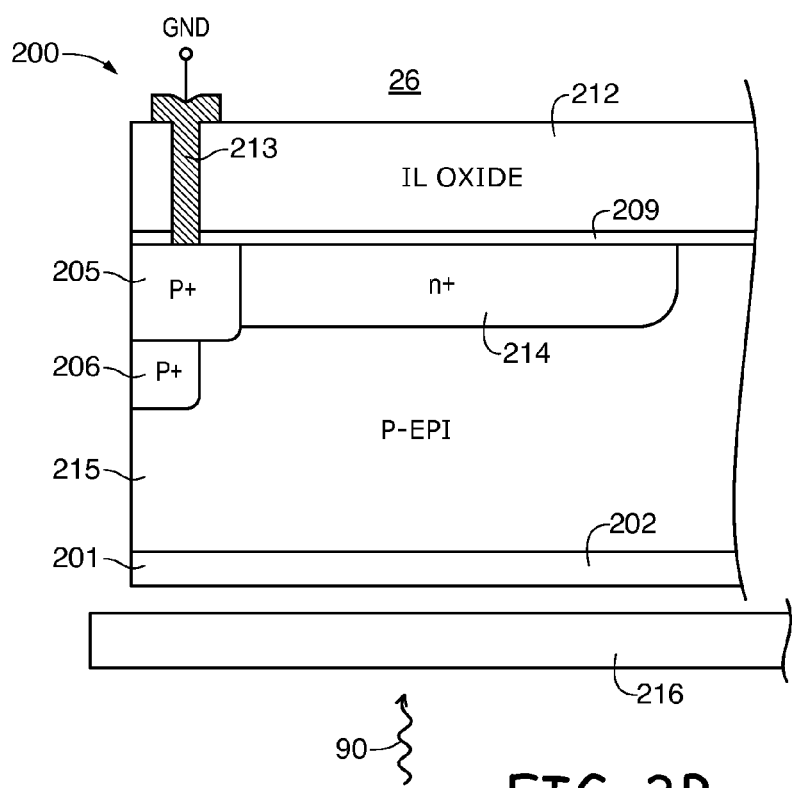
FIG. 3B is a cross-sectional diagram of a temperature sensor pixel photodiode formed in a highly-doped n+ type layer that causes the photodiode to generate increased dark current in accordance with an embodiment of the present invention.

FIG. 3B is a cross-sectional side view of a portion of an illustrative temperature sensor pixel such as temperature sensor pixel 26 of FIG. 2. Temperature sensor pixel 26 may include a corresponding photodiode 200. Photodiode 200 may be formed on substrate 201 of array 18 (e.g., corresponding to substrate 101 of FIG. 3B). In contrast to photodiode 100 of light sensing image sensor pixel 24 described in connection with FIG. 3A, a p+ type doped layer such as p+ type doped layer 107 of pixel 24 is not formed in photodiode 200 of temperature sensor pixel 26. As such, photodiode 200 is not provided with the same dark-current reducing qualities afforded to photodiode 100 due to p+ type doped layer 107. Photodiode 200 of temperature sensor pixel 26 is formed by heavily-doped n+ type layer 214 at the front surface of substrate 201. The front (upper) surface of epitaxial p-type doped layer 215 (corresponding to layer 115 of FIG. 3A) is covered by oxide layer 209 (corresponding to layer 109). Temperature sensor pixels 26 may be isolated from each other (and from image sensor pixels 24) by p+ type doped regions 205 and 206 that may extend through epitaxial p-type doped layer 215 down to p+ type doped layer 202. The pixel is covered by inter-level (IL) oxide layers 212 (only one inter-level oxide layer is shown) that are used for the pixel metal wiring and interconnect isolation. The active pixel circuit components are connected to the wiring by metal vias deposited through contact holes 213.

Photodiode 200 may be configured to generate increased dark current relative to photodiode 100 of image sensor pixels 24. For example, by removing p+ type doped layer 107, the dark current-preventing properties afforded to photodiode 100 may not be provided in photodiode 200. Therefore, dark current generated by photodiode 200 is not suppressed, and an increased dark current signal may be generated by photodiode 200 compared to the dark current generated by photodiode 100 in a similar environment. Additionally, heavily-doped n+ type layer 214 may allow increased dark current to be generated by photodiode 200 relative to image sensor pixel 24. Because the temperature of temperature sensor pixels 26 increase as the temperature of array 18 increases, temperature sensor pixels 26 may generate increased dark current when the temperature of photodiode 200 increases. Photodiode 200 may be more sensitive to temperature increases than photodiode 100 due to the presence of highly-doped n+ type layer 214 and the absence of p+ type doped region 107, and may demonstrate greater changes in dark current generation in response to temperature changes in array 18 than photodiode 100 of FIG. 3A.

If desired, temperature sensor pixels 26 may be provided with light-blocking material 216 that covers photodiode 200 and prevents photons 90 from impinging upon photodiode 200. Light-blocking material 216 may include metal, plastic, ceramic, or any other suitable material for blocking light and preventing photons 90 from impinging upon photodiode 200. In one illustrative example, light-blocking material 216 includes aluminum. Photodiode 200 may therefore be configured to receive no light and may generate no photocurrent due to impinging photons 90. Because photodiode 200 does not receive light, photodiode 200 may generate no photocurrent (e.g., the only current produced by photodiode 200 of temperature sensor pixel 26 may be dark current). This example is merely illustrative. In examples where array 18 is front-side illuminated, layer 216 may be formed adjacent to the front side of substrate 201.

Because photodiode 200 may be configured to generate signals in response only to dark current and may have increased sensitivity to dark current generation in response to temperature changes in array 18, temperature sensor pixels 26 may be well-equipped to provide temperature data on array 18 based on the dark current generated by pixels 26. This temperature data may be used to determine the temperature at various positions on array 18, and may be used to estimate the temperatures of image sensor pixels 24 in various regions of array 18. Because the level of dark current produced by the image sensor pixels 24 is temperature-dependent, dark current generated by the pixels in those regions of array 18 may be calculated based on the dark temperature data generated by temperature sensor pixels 26 (by, for example, interpolation of the temperature sensor measurements determined from the dark current signals generated by temperature sensor pixels 26). If the temperature at a given location of the array can be determined, the dark current generated by pixels in that area can be calculated based on the data from the temperature sensors, and the dark current contribution to the overall signal (photocurrent signal plus dark current signal, for example) generated by photodiodes 100 of image sensor pixels 24 may compensated for. This may result in greater sensitivity of image sensor pixels 24.

Figure 4:
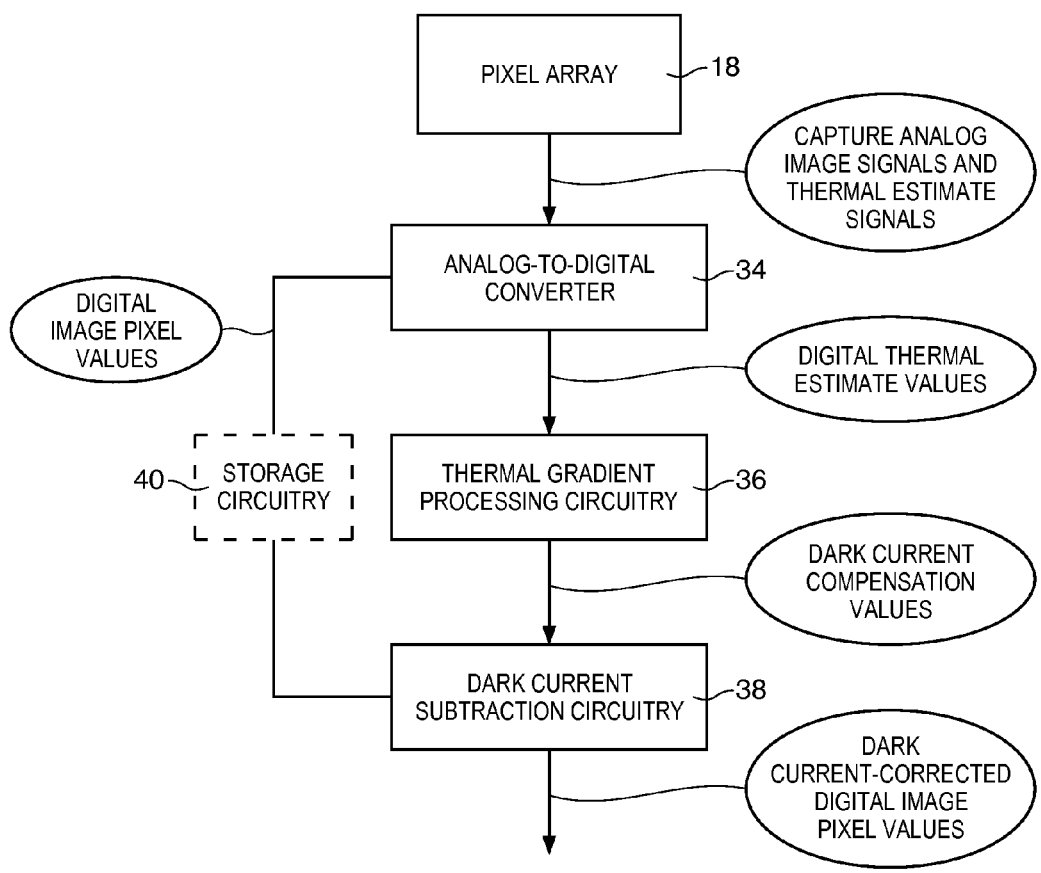
FIG. 4 is a diagram showing how pixel readout and processing circuitry in an imaging system may be used to perform dark current subtraction operations on digital image pixel values using dark current compensation values that have been calculated using digital thermal estimate values generated by temperature sensor pixels of the type shown in FIGS. 2 and 3B in accordance with an embodiment of the present invention.

FIG. 4 is an illustrative diagram showing how pixel readout and processing circuitry in an imaging system may be used to perform dark current subtraction on digital image pixel values. Image sensor pixels 24 in pixel array 18 may generate analog image signals in response to light that is transmitted to pixel array 18 by lens 14 (FIG. 1). In some illustrative examples, each image sensor pixel 24 in pixel array 18 may generate an analog image signal in response to light that is incident upon the image sensor pixel and photodiode 100 contained therein. Temperature sensor pixels 26 in pixel array 18 may generate thermal estimate signals in response to the temperature of temperature sensor pixels 26 in image pixel array 18. For example, each temperature sensor pixel 26 may generate a thermal estimate value that corresponds to the temperature of the individual temperature sensor pixel 26 that generates the thermal estimate signal. The thermal estimate signals generated by temperatures sensor pixels 26 may be, for example, produced entirely by dark current signal contributions. In one illustrative embodiment, temperature sensor pixels 26 may be arranged around the edge of image pixel array 18 (as shown in FIG. 2), and therefore may generate thermal estimate signals that are estimates of the temperature of pixel array 18 in the border region of pixel array 18. By forming the border of array 18 from temperature pixels 26, a thermal estimate signal may be generated for each row and each column of array 18. This example is merely illustrative. In general, temperature sensor pixels 26 may be any type of pixel or suitable temperature sensor, and may be positioned in any desired location in or relative to pixel array 18.

Image sensor pixels 24 and temperature sensor pixels 26 may transmit respective analog image signals and thermal estimate signals to pixel control and readout circuitry 20, which may include analog-to-digital converter (ADC) converter circuitry 34, thermal gradient processing circuitry 36, and dark current subtraction circuitry 38. Pixel control and readout circuitry 20 may include storage circuitry 40 for storing digital image pixel values from image sensor pixels 24.

If desired, ADC circuitry 34 may include one or more analog-to-digital converter circuits. ADC circuitry 34 may perform analog-to-digital conversion operations on the analog image signals received from image sensor pixels 24 in pixel array 18 to generate digital image data (e.g., digital image pixel values). Each analog image signal corresponding to one of image sensor pixels 24 may be converted into a digital image pixel value corresponding to the image sensor pixel 24. ADC circuitry 34 may perform analog-to-digital conversion operations on the thermal estimate signals received from temperature sensor pixels 26 in pixel array 18 to generate digital thermal estimate values. Each temperature sensor pixel 26 may have an associated digital thermal estimate value generated form a corresponding thermal estimate signal. ADC circuitry 34 may include any desired type of ADC architecture (e.g., direct conversion ADC architecture, integrating ADC architecture, successive-approximation ADC architecture, ramp-compare ADC architecture, etc.). ADC circuitry 34 may transmit the digital thermal estimate values to thermal gradient processing circuitry 36. In one illustrative example, ADC circuitry 34 may transmit the digital image pixel values to dark current subtraction circuitry 38 (sometimes referred to herein as dark current compensation circuitry 38). ADC circuitry 34 may transmit the digital image pixel values to storage circuitry 40 for temporary or permanent storage of the digital image pixel values. When ready for use by dark current subtraction circuitry 38, digital image pixel values may be transmitted from storage circuitry 40 to dark current subtraction circuitry 38 for processing.

Thermal gradient processing circuitry 36 may generate dark current compensation values based on digital thermal estimate values received from ADC circuitry 34. In one illustrative example, thermal gradient processing circuitry 36 may generate dark current compensation values for the image sensor pixels 24 in pixel array 18 based on the thermal estimate signals (e.g., dark current signals) from the temperature sensor pixels 26 located around the border of pixel array 18. In an image pixel array such as pixel array 18, it may be desirable to use temperature data such as digital thermal estimate values to determine the compensation appropriate for each individual image sensor pixel 24 in pixel array 18, as the temperatures of, and therefore the dark current generated by, each image sensor pixel 24 in pixel array 18 may be different. In one illustrative example, thermal gradient processing circuitry 36 uses digital thermal estimate values received from ADC circuitry 34 to generate a digital thermal gradient for each pixel 24 in pixel array 18.

The digital thermal gradient generated by thermal gradient processing circuitry 36 may, for example, be representative of thermal gradient 28 that develops on pixel array 18. Thermal gradient processing circuitry 36 may generate dark current compensation values for each image sensor pixel 24 in array 18. These dark current compensation values may be based on the digital thermal gradient generated by thermal processing circuitry 36, or may be generated directly from the digital thermal estimate values provided to thermal gradient processing circuitry 36. In one illustrative example, thermal gradient processing circuitry 36 generates a dark current compensation value for each image sensor pixel 24 in pixel array 18 based on digital thermal estimate values corresponding to temperature sensor pixels 26. The dark current compensation value may represent the estimated dark current produced by the individual image sensor pixel 24 based on the digital thermal estimate values generated from the thermal estimate signals obtained by the temperatures sensor pixels 26 in the pixel array 18. That is, each dark current compensation value may be used to compensate for the dark current produced by the image sensor pixel 24 based on the estimated temperature of the image sensor pixel 24, as determined from the digital thermal estimate values. Dark current compensation values may be generated for each pixel 24 (e.g., each pixel location on array 18) by interpolating digital thermal estimate values generated by ADC circuitry 34 based on thermal estimate signals generated by temperatures sensor pixels 26. For example, linear combinations or weighted sums of one or more (e.g., all) of the thermal estimate values may be generated by temperature sensor pixels 26 and/or thermal gradient processing circuitry 36 for a given frame of image data.

Dark current compensation circuitry 38 may receive dark current compensation values from thermal gradient processing circuitry 36. In one illustrative embodiment, dark current compensation circuitry 38 receives a separate dark current compensation value for each image sensor pixel 24 in pixel array 18. This, however, is merely illustrative. Dark current compensation circuitry may receive dark current compensation values that correspond to one pixel, two pixels, more than two pixels, ten pixels, or any other suitable number of pixels in pixel array 18. Alternatively, dark current compensation circuitry may receive dark current compensation values corresponding to a cluster of image sensor pixels 24, a row of image sensor pixels 24, a column of image sensor pixels 24, or any other suitable grouping of image sensor pixels 24 in pixel array 18.

Dark current compensation circuitry 38 may receive digital image pixel values from ADC circuitry 34. In one illustrative embodiment, dark current subtraction circuitry 38 may receive digital image pixel values from storage circuitry 40, such as when image pixel values are transmitted from ADC circuitry 34 to storage circuitry 40 for temporary or permanent storage prior to being transmitted to dark current subtraction circuitry 38. Dark current subtraction circuitry 38 may receive a digital image pixel value for each image sensor pixel 24 in pixel array 18.

The digital image pixel values received at dark current subtraction circuitry 38 may be generated from captured analog image signals having a photocurrent contribution and a dark current contribution. Therefore, the digital image pixel values received at dark current subtraction circuitry 38 may be representative of the combined dark current signal and photocurrent signal generated by photodiode 100 of image sensor pixel 24 in pixel array 18. In order to provide pixel data that accurately represents the photocurrent generated by photodiode 100 and contains a minimum dark current contribution, it may be desirable to compensate the digital image pixel values for their dark current contributions. Dark current subtraction circuitry 38 may accomplish this by using dark current compensation values from thermal gradient processing circuitry 36 to compensate for the dark current contributions of digital image pixel values from ADC circuitry 34 or storage circuitry 40. In one illustrative example in which each image sensor pixel 24 has a corresponding digital image pixel value and a corresponding dark current compensation value, a dark-current corrected pixel value may be generated for the image sensor pixel 24 by subtracting the dark current compensation value associated with image sensor pixel 24 from the digital image pixel value associated with image sensor pixel 24. Dark current subtraction circuitry may therefore produce a dark current-corrected pixel value for image sensor pixel 24 that has a reduced dark current component. In one illustrative example, dark current-corrected pixel values may be calculated for every image sensor pixel 24 in array 18 in this manner. Dark current-corrected pixel values for each image sensor pixel 24 in pixel array 18 may then be transmitted to additional image processing circuitry such as storage and processing circuitry 22 for further storage or processing.

As discussed in connection with FIG. 4 above, it may be desirable to compensate for the dark current generated by each image sensor pixel 24 based on the estimated temperature of each image sensor pixel 24. In one illustrative example, this may be accomplished by generating a dark current compensation value for each image sensor pixel 24 in pixel array 18.

Figure 5A:
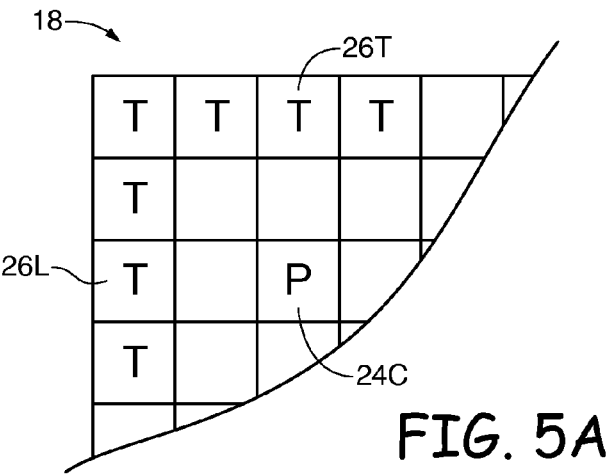
FIG. 5A is a diagram of an illustrative pixel array having an image pixel with an associated image pixel value that has not been compensated for dark current in accordance with an embodiment of the present invention.

FIG. 5A shows one illustrative example in which a dark current compensation value for an image sensor pixel 24 such as image sensor pixel 24C having a digital image pixel value P is to be generated. In the illustrative example of FIG. 5A, this may be accomplished using the digital thermal estimate values from the temperature sensor pixels 26 located around the border of image pixel array 18. For example, each temperature sensor pixel 26 located around the border of pixel array 18 may have a corresponding digital thermal estimate value. Digital thermal estimate values corresponding to multiple temperature sensor pixels 26 may be used to generate a dark current compensation value for a given image sensor pixel 24 such as image sensor pixel 24C. In one illustrative example, a first temperature sensor pixel 26T may be located in a column along the top edge of the border of pixel array 18, and a second temperature sensor pixel 26B (as shown in FIG. 2) may be located in the same column along the bottom edge of image pixel array 18. Similarly, a third temperature sensor pixel 26L may be located in a row along the left edge of the border of pixel array 18, and a fourth temperature sensor pixel 26R (as shown in FIG. 2) may be located in the same row along the right edge of image pixel array 18. Each of temperature sensor pixels 26T, 26B, 26L, and 26R may be operating at a temperature that may be dependent on the location of each pixel on image pixel array 18 and may each generate a respective thermal estimate signal that is representative of the temperature of the respective temperature sensor pixel.

The thermal estimate signals generated by temperature sensor pixels 26T, 26B, 26L, and 26R may be dark current signals. Each of these thermal estimate signals may be used to generate a digital thermal estimate value for each of temperature sensor pixels 26T, 26B, 26L, and 26R. The digital thermal estimate values for one or more of temperature sensor pixels 26T, 26B, 26L, and 26R may then be used to generate a dark current compensation value for an image sensor pixel 24 in image pixel array 18, such as image sensor pixel 24C. In such an example, image sensor pixel 24C is the image sensor pixel 24 that is located at the intersection of the column in which temperatures sensor pixels 24T and 24B are located and the row in which temperature sensor pixels 24L and 24R are located. This example in which the compensation value is generated for a given pixel location based on temperature estimate values from the same row and column of that pixel in the array is merely illustrative. In general, a dark current compensation value for any image sensor pixel 24 in pixel array 18 may be generated based on any one or combination of temperatures sensor pixels 26 in array 18.

Figure 5B:
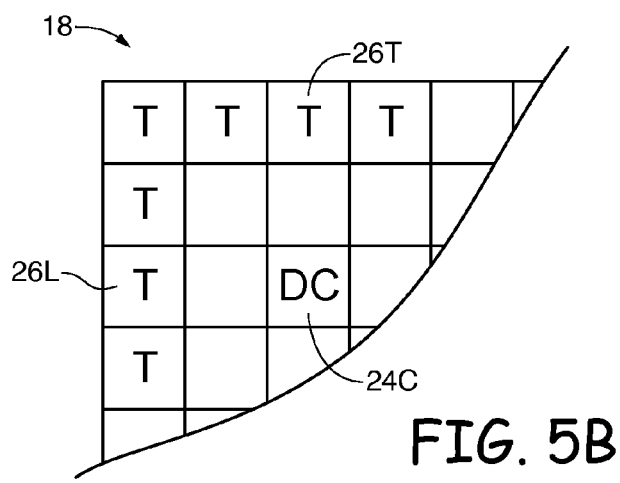
FIG. 5B is a diagram of an illustrative pixel array having an image pixel with an associated dark current compensation value calculated based on digital thermal estimate values generated by temperature sensor pixels in accordance with an embodiment of the present invention.

FIG. 5B shows image sensor pixel 24C for which a dark current compensation value DC has been generated. Dark current compensation value DC may be generated based on the digital thermal estimate values of temperature sensor pixels 24T, 24B, 24L, and 24R, as described in connection with FIG. 5A. In FIG. 5B, dark current compensation value DC may be interpolated based on the digital thermal estimate values of temperature sensor pixels 24T, 24B, 24L, and 24R. Such an interpolation may be performed by weighting the digital thermal estimate values for each of the temperature sensor pixels 24T, 24B, 24L, and 24R relative to their location with respect to image sensor pixel 24C. In one illustrative embodiment, bilinear interpolation using the digital thermal estimate values for each of the temperature sensor pixels 24T, 24B, 24L, and 24R may be used to generate a dark current compensation value for image sensor pixel 24C. For example, digital thermal estimate values of the temperature sensor pixels 24T, 24B, 24L, and 24R may be used to generate a digital thermal estimate value for image sensor pixel 24C, which may then be converted to a dark current compensation value. These examples, however, are merely illustrative. Digital thermal estimate values for each of the temperature sensor pixels 24T, 24B, 24L, and 24R may be used to generate a corresponding value for image sensor pixel 24C that may undergo any processing necessary to render a suitable dark current compensation value DC for image sensor pixel 24C.

In one illustrative example, an averaged digital thermal estimate value for each of temperature sensor pixels 26T, 26B, 26L, and 26R may be generated to reduce noise in the digital thermal estimate values due to steep temperature gradients on image pixel array 18. In such an embodiment, the digital thermal estimate values of temperature sensor pixels surrounding each of temperature sensor pixels 26T, 26B, 26L, and 26R may be used to generate an averaged digital thermal estimate value. For example, the digital thermal estimate value of temperature sensor pixel 26T may be averaged with the digital thermal estimate value of a temperature sensor pixel on either side of temperatures sensor pixel 26T (e.g., a temperature sensor pixel on the left of temperature sensor pixel 26T and a temperature sensor pixel on the right of temperature sensor pixel 26T). Similar averaged digital temperature sensor values for each of temperature sensor pixels 26B, 26L, and 26R may be generated using a similar method as described for temperature sensor pixel 26T. These averaged temperature sensor values for temperature sensor 26T, 26B, 26L, and 26R may then be used to generate a dark current compensation value DC for image sensor pixel 24C as described above in connection with FIG. 5B.

Figure 5C:
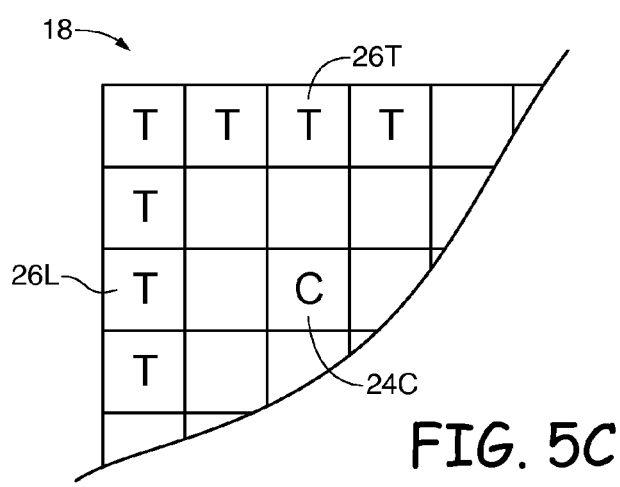
FIG. 5C is a diagram of an illustrative pixel array having an image pixel with a dark current-corrected pixel value generated by subtracting the associated dark current compensation value from the image pixel value in accordance with an embodiment of the present invention.

FIG. 5C shows image sensor pixel 24C having a dark current-corrected digital image pixel value C. Dark current-corrected digital image pixel value C may be generated based on digital image pixel value P of image sensor pixel 24C and dark current compensation value DC that was generated for image sensor pixel 24C based on the digital thermal estimate values or averaged digital thermal estimate values of temperature sensor pixels 26T, 26B, 26L, and 26R. In one illustrative example, dark current compensation value DC is subtracted from digital image pixel value P to generate dark current-corrected digital image pixel value C for digital image sensor pixel 24C. This, however is merely illustrative. Dark current-corrected digital image pixel value C may be generated using any suitable processing of digital image pixel values and dark current-correction values of image sensor pixels 24C in pixel array 18. Dark current-corrected digital image pixel value C may subsequently be transmitted to additional image processing circuitry such as storage and processing circuitry 22 for further storage or processing.

In one suitable arrangement, analog image signals and thermal estimate signals for each of image sensor pixels 24 and temperature sensor pixels 26 may be generated by scanning pixel array 18 using pixel control and readout circuitry 20 or other suitable circuitry in image sensor 16. In such an example, scanning of image sensor pixels 24 and temperature sensor pixels 26 may occur when an image frame is being captured by camera module 12. Analog image signals and thermal estimate signals may be converted to digital image pixel values and digital thermal estimate values, and the digital thermal estimate values may be used to generate a digital thermal gradient representative of a thermal gradient such as thermal gradient 28 on pixel array 18. The digital thermal gradient may then be used to generate dark current compensation values for image pixels 24. In another suitable arrangement, no digital thermal gradient may be generated, and dark current compensation values for each of image sensor pixels 24 may be generated directly based on the digital thermal estimate values. In one suitable arrangement, digital image pixel values may be stored in storage circuitry 40 while a digital thermal gradient and/or dark current compensation values are being generated for the frame for which the digital image pixel values were generated. Once the dark current compensation values have been generated for the digital image pixels, both the dark current compensation values and the digital image pixel values may be received at dark current compensation circuitry 38 and used to generate dark current-corrected digital image pixel values. In such an arrangement, digital thermal estimate values may be representative of the temperature of temperature sensor pixels 26 at the time of scanning of pixel array 18 to generate the specific frame for which the digital image pixel values of image sensor pixels 24 correspond. The dark current compensation values applied to each of digital image pixels 24 may therefore be based on the estimated temperature and dark current contributions of digital image pixels 24 at the time of scanning to generate the image frame.

Because the thermal profile of pixel array 18 may remain relatively constant over time, it may not be necessary to apply dark current compensation values that were generated at the time of image capture to image sensor pixels 24. For example, dark current generated by image sensor pixels 24 may be compensated based on a previously generated digital thermal gradient or previously generated dark current compensation values. In such a scenario, both image sensor pixels 24 and temperature sensor pixels 26 may be scanned at the time of image capture by camera module 12, and digital image pixel values and digital thermal estimate values may both be generated. However, digital image pixel values may be sent directly to dark current subtraction circuitry 38 (that is, digital image pixel values may not be sent to storage circuitry 40). At dark current subtraction circuitry 38, dark current correction values generated for a previous frame (for example, the frame captured immediately before the current frame) may be applied to the digital image pixel values of the current frame to generate dark current-corrected digital image pixel values that provide accurate dark current compensation. In other words, dark current compensation values and digital thermal gradients may be stored and applied to digital image pixel values other than the digital image pixel values corresponding to the frame for which the dark current compensation values were generated. In the meantime, digital thermal estimate values generated for the current frame may be processed at thermal gradient processing circuitry to generate dark current compensation values or a digital thermal profile to be applied to a subsequent frame. Performing thermal gradient processing and dark current subtraction in this manner may result in faster processing of image pixel data. This, however, is merely illustrative. Thermal estimate signals and digital thermal estimate values may be used to generated dark current correction values and digital thermal gradients to be applied to digital image pixel values that correspond to any image frame captured from image pixel array 18 using camera module 12 or any other suitable circuitry in electronic device 10.

Figure 6:
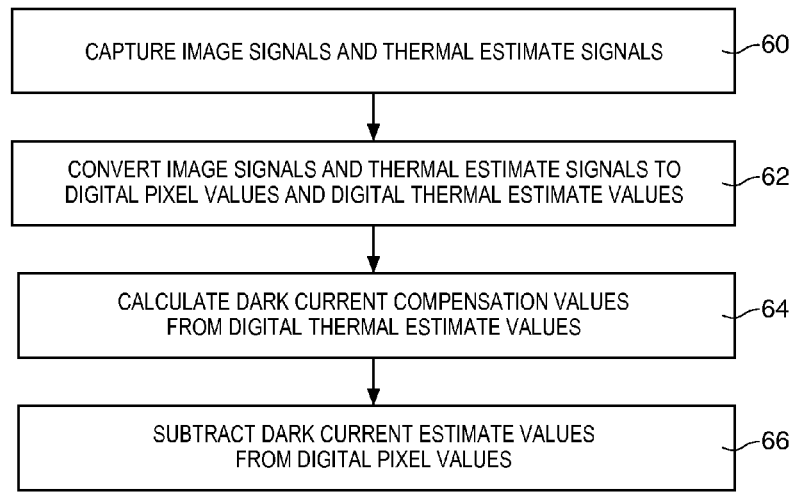
FIG. 6 is a flow chart of illustrative steps that may be performed by pixel readout and processing circuitry in an imaging system to perform dark current subtraction operations on digital image pixel values using dark current compensation values that have been calculated using digital thermal estimate values generated by temperature sensor pixels in accordance with an embodiment of the present invention.

FIG. 6 is a flow chart of illustrative steps that may be performed by processing circuitry such as pixel control and readout circuitry 20 of FIG. 1 for generating dark current-compensated digital image pixel values.

At step 60, image sensor pixels 24 and temperature sensor pixels 26 may capture analog image signals and thermal estimate signals. For example, light that is incident upon image sensor pixels 24 may generate photocurrent that is used to generate an analog image signal, and a thermal estimate signal may be generated by temperature sensor pixel 26 based on dark current that flows in temperature sensor pixel 26. Analog image signals and thermal estimate signals may be transmitted to ADC circuitry 34.

At step 62, ADC circuitry 34 may convert the analog image signals and thermal estimate signals to digital image pixel values and digital thermal estimate values. ADC circuitry 34 may transmit digital image pixel values to dark current compensation circuitry 38, or to storage circuitry 40. ADC circuitry 34 may transmit the digital thermal estimate values to thermal gradient processing circuitry 36.

At step 64, thermal gradient processing circuitry 36 may generate dark current compensation values based on the digital thermal estimate values received from ADC circuitry 34. If desired, thermal gradient processing circuitry 36 may generate a digital thermal gradient based on the digital thermal estimate values. The digital thermal gradient may be used to generate dark current compensation values, or dark current compensation values may be generated based on digital thermal estimate values without generating a digital thermal gradient. In some examples, dark current compensation values are generated for each image sensor pixel 24 in pixel array 18. Dark current compensation values may be generated by using weighted or averaged values of digital thermal estimate values from temperature sensor pixels 26. Dark current compensation values may be transmitted to dark current subtraction circuitry 38.

At step 66, dark current subtraction circuitry 38 may use digital image pixel values from ADC circuitry 34 or storage circuitry 40 and dark current compensation values from thermal gradient processing circuitry 36 to generate dark current-corrected digital image pixel values for digital image pixels 24 in pixel array 18. If desired, dark current-corrected digital image pixel values may be generated by simply subtracting a dark current compensation value from a digital image pixel value. Dark current-corrected digital image pixel values may then be transmitted to additional circuitry such as storage and processing circuitry 22 for further processing or storage.

Figure 7:
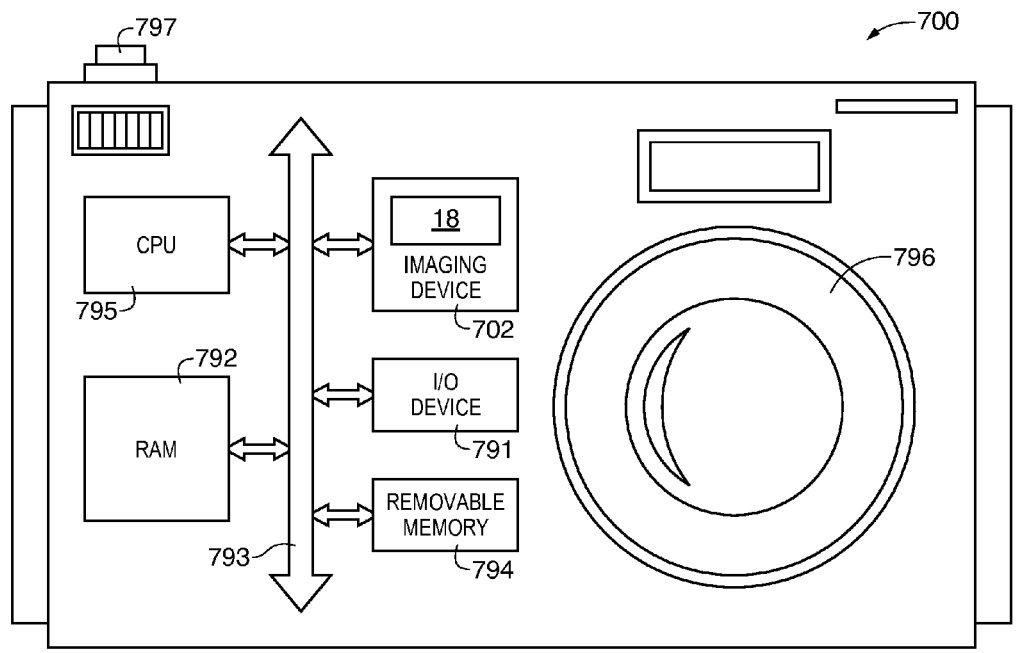
FIG. 7 is a block diagram of a processor system employing the embodiments of FIGS. 1-6 in accordance with an embodiment of the present invention.

FIG. 7 shows in simplified form a typical processor system 700, such as a digital camera, which includes an imaging device 702 (e.g., an imaging device 702 such as image sensor 16 and storage and processing circuitry 22 of FIGS. 1-6 employing temperature sensor pixels, circuitry for compensating for dark current in image sensor pixels, and the techniques for operations described above). Processor system 700 is exemplary of a system having digital circuits that may include imaging device 702. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 700, which may be a digital still or video camera system, may include a lens such as lens 796 (which may include lenses 14) for focusing an image onto a pixel array such as pixel array 18 when shutter release button 797 is pressed. Processor system 700 may include a central processing unit such as central processing unit (CPU) 795. CPU 795 may be a microprocessor that controls camera functions and one or more image flow functions and communicates with one or more input/output (I/O) devices 791 over a bus such as bus 793. Imaging device 702 may communicate with CPU 795 over bus 793. Processor system 700 may include random access memory (RAM) 792 and removable memory 794. Removable memory 794 may include flash memory that communicates with CPU 795 over bus 793. Imaging device 702 may be combined with CPU 795, with or without memory storage, on a single integrated circuit or on a different chip. Although bus 793 is illustrated as a single bus, it may be one or more buses or bridges or other communication paths used to interconnect the system components.

A method for operating an imaging system having image sensor pixels and temperatures sensor pixels arranged in a pixel array may include generating image signals with the image sensor pixels and generating thermal estimate signals with the temperature sensor pixels. The method may include converting the image signals into digital image pixel values and converting the thermal estimate signals into digital thermal estimate values with converter circuitry. The method may include generating dark current compensation values based on the digital thermal estimate values with thermal gradient processing circuitry. The method may include generating dark current-corrected digital image pixel values by subtracting the generated dark current compensation values from the digital image pixel values with dark current subtraction circuitry.

If desired, the temperature sensor pixels may be formed along a periphery of the pixel array having first and second opposing edges and third and fourth opposing edges that extend between the first and second opposing edges. The image sensor pixels and the temperature sensor pixels may be arranged in rows and columns in the pixel array. A first temperature sensor pixel may be formed on the first edge and a second temperature sensor pixel may be formed on the second edge and in a common row of the pixel array. A third temperature sensor pixel may be formed on the third edge and a fourth temperature sensor pixel may be formed on the fourth edge of the border in a common column of the pixel array. Each of the first, second, third, and fourth temperatures sensor pixels may generate a corresponding digital thermal estimate value. Generating the dark current compensation value for the image sensor pixel may include interpolating the corresponding digital thermal estimate values generated by the first, second, third and fourth temperature sensor pixels.

If desired, generating the dark current compensation value for a selected image sensor pixel may include processing digital thermal estimate values from a plurality of temperature sensor pixels. The image signals generated by the selected image sensor pixel may include a photocurrent component and a dark current component. The thermal estimate signals may include a dark current component without photocurrent components. Generating the dark current compensation value for the selected image sensor pixel may include generating the dark current compensation value based on the dark current component of the thermal estimate signals.

If desired, each image sensor pixel in the array may generate a respective digital image pixel value. Generating the dark current compensation values may include generating a respective dark current compensation value for each image sensor pixel in the array. Subtracting the dark current compensation values from the digital image pixel values to produce the dark current-corrected digital image pixel values may include subtracting the respective dark current compensation value for each image sensor pixel in the array from the respective digital image signal generated by that image sensor pixel.

If desired, the digital image pixel values and the dark current compensation values may be generated for a current image frame that is captured by the imaging system, and the dark current-corrected digital image pixel values may be generated using the digital image pixel values and the dark current compensation values generated for the current image frame that is captured by the imaging system.

If desired, the digital image pixel values may be generated for a first image frame that is captured by the imaging system, and the dark current compensation values may be generated for a second image frame that is captured by the imaging system prior to capturing the first image frame. The dark current-corrected digital image pixel values may be generated using the digital image pixel values generated for the first image frame and the dark current compensation values generated for the second image frame.

An image pixel array arranged in rows and columns and having a border may include image sensor pixels configured to generate image data in response to image light. The image sensor pixels may be formed within the border of the image pixel array. The image pixel array may include temperature sensor pixels configured to generate temperature estimate values for mitigating dark current contributions in the image data generated by the image sensor pixels. The temperature sensor pixels may be formed along the border of the image pixel array in a plurality of the rows and a plurality of the columns of the image pixel array.

If desired, the image pixel array may be formed on a semiconductor substrate. The temperature sensor pixels may include a light-blocking member formed over the semiconductor substrate that is configured to prevent the temperature sensor pixels from receiving the image light. The light-blocking member may include aluminum.

If desired, the image sensor pixels may include at least a first photodiode that produces a first amount of dark current, and the temperature sensor pixels may include at least a second photodiode that produces a second amount of dark current. The second amount of dark current may be greater than the first amount of dark current. The at least first photodiode may include a buried n-type doped layer that produces the first amount of dark current. The second photodiode may include a heavily-doped n+ type layer that produces the second amount of dark current such that the temperature sensor pixels are more sensitive to temperature fluctuations across the array than the image sensor pixels.

A system may include a central processing unit, memory, input-output circuitry, and an imaging device. The imaging device may include a pixel array of image sensor pixels and temperature sensor pixels, a lens that focuses an image on the pixel array, analog-to-digital converter circuitry, thermal gradient processing circuitry, and dark current subtraction circuitry. The image sensor pixels may generate image signals in response to the image. The temperature sensor pixels may generate thermal estimate signals in response to at least one temperature of the pixel array. The analog-to-digital converter circuitry may generate digital image pixel values based on the image signals and may generate digital thermal estimate values based on the thermal estimate signals. The thermal gradient processing circuitry may generate dark current compensation values based on the digital thermal estimate values. The dark current subtraction circuitry may subtract the dark current compensation values from the digital image pixel values.

If desired, the temperature sensor pixels may include first photodiodes that generate a first amount of dark current. The image sensor pixels may include second photodiodes that generate a second amount of dark current that is less than the first amount of dark current. The dark current compensation values may compensate for the second amount of dark current produced by the image sensor pixels.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for operating an imaging system having image sensor pixels and temperature sensor pixels arranged in a pixel array, converter circuitry, thermal gradient processing circuitry, and dark current subtraction circuitry, wherein the temperature sensor pixels are formed along a periphery of the pixel array, wherein the periphery has first and second opposing edges and third and fourth opposing edges that extend between the first and second opposing edges, wherein the image sensor pixels and the temperature sensor pixels are arranged in rows and columns in the pixel array, wherein a first temperature sensor pixel is formed on the first edge and a second temperature sensor pixel is formed on the second edge, wherein the first and second temperature sensor pixels are formed in a common row of the pixel array, wherein a third temperature sensor pixel is formed on the third edge and a fourth temperature sensor pixel is formed on the fourth edge, and wherein the third and fourth temperature sensor pixels are formed in a common column of the pixel array, the method comprising:

with the image sensor pixels, generating image signals;
with the temperature sensor pixels, generating thermal estimate signals;

with the converter circuitry, converting the image signals into digital image pixel values and converting the thermal estimate signals into digital thermal estimate values, wherein each of the first, second, third, and fourth temperature sensor pixels generates a corresponding thermal estimate signal that is converted into a corresponding digital thermal estimate signal;

with the thermal gradient processing circuitry, generating dark current compensation values based on the digital thermal estimate values, wherein generating the dark current compensation value for a given one of the image sensor pixels comprises interpolating the corresponding digital thermal estimate signals generated by the first, second, third and fourth temperature sensor pixels; and with the dark current subtraction circuitry, generating dark current-corrected digital image pixel values by subtracting the generated dark current compensation values from the digital image pixel values.

2. The method of claim 1, wherein the image signal generated by the given one of the image sensor pixels comprises a photocurrent component and a dark current component and wherein the thermal estimate signals comprise a dark current component without photocurrent components.

3. The method of claim 2, wherein generating the dark current compensation value for the given one of the image sensor pixels comprises generating the dark current compensation value based on the dark current component of the corresponding thermal estimate signals.

4. The method defined in claim 1, wherein each image sensor pixel in the array generates a respective digital image pixel value and wherein generating the dark current compensation values comprises generating a respective dark current compensation value for each image sensor pixel in the array.

5. The method defined in claim 4, wherein subtracting the dark current compensation values from the digital image pixel values to produce the dark current-corrected digital image pixel values comprises subtracting the respective dark current compensation value for each image sensor pixel in the array from the respective digital image signal generated by that image sensor pixel.

6. The method defined in claim 5, wherein the digital image pixel values and the dark current compensation values are generated for a current image frame that is captured by the imaging system, and wherein the dark current-corrected digital image pixel values are generated using the digital image pixel values and the dark current compensation values generated for the current image frame that is captured by the imaging system.

7. The method defined in claim 5, wherein the digital image pixel values are generated for a first image frame that is captured by the imaging system, wherein the dark current compensation values are generated for a second image frame that is captured by the imaging system prior to capturing the first image frame, and wherein the dark current-corrected digital image pixel values are generated using the digital image pixel values generated for the first image frame and the dark current compensation values generated for the second image frame.

8. An image pixel array arranged in rows and columns and having a border, the image pixel array comprising:

image sensor pixels formed within the border of the image pixel array, wherein the image sensor pixels are configured to generate image data in response to image light, wherein the image sensor pixels comprise at least a first photodiode having a buried n-type doped layer; and temperature sensor pixels formed along the border of the image pixel array in a plurality of the rows and a plurality of the columns of the image pixel array, wherein the temperature sensor pixels are configured to generate temperature estimate values for mitigating dark current contributions in the image data generated by the image sensor pixels, wherein the temperature sensor pixels comprise at least a second photodiode having a heavily-doped n+ type layer that is not buried, and wherein temperature sensor pixels are more sensitive to temperature fluctuations across the array than the image sensor pixels.

9. The image pixel array of claim 8, wherein the image pixel array is formed on a semiconductor substrate and the temperature sensor pixels further comprise:

a light-blocking member formed over the semiconductor substrate that is configured to prevent the temperature sensor pixels from receiving the image light.

10. The image pixel array of claim 9, wherein the light-blocking member comprises aluminum.

11. A system, comprising:

a central processing unit;

memory;

input-output circuitry;

an imaging device, wherein the imaging device comprises:

a pixel array of image sensor pixels and temperature sensor pixels;

a lens that focuses an image on the pixel array, wherein the image sensor pixels are configured to generate image signals in response to the image, and wherein the temperature sensor pixels are configured to generate thermal estimate signals in response to at least one temperature of the pixel array, wherein the temperature sensor pixels comprise first photodiodes configured to generate a first amount of dark current, and wherein the image sensor pixels comprise second photodiodes configured to generate a second amount of dark current that is less than the first amount of dark current;

analog-to-digital converter circuitry configured to generate digital image pixel values based on the image signals and configured to generate digital thermal estimate values based on the thermal estimate signals;

thermal gradient processing circuitry configured to generate dark current compensation values based on the digital thermal estimate values; and dark current subtraction circuitry configured to subtract the dark current compensation values from the digital image pixel values.

12. The system of claim 11, wherein the dark current compensation values are configured to compensate for the second amount of dark current produced by the image sensor pixels.

* * * * *